US009874588B2

(12) United States Patent
Mouvet et al.

(10) Patent No.: US 9,874,588 B2
(45) Date of Patent: Jan. 23, 2018

(54) METHOD FOR DETERMINING THE AVERAGE VALUE OF A PERIODIC OR QUASI-PERIODIC VOLTAGE SIGNAL

(71) Applicant: RENAULT s.a.s., Boulogne-Billancourt (FR)

(72) Inventors: Matthieu Mouvet, Versailles (FR); Florian Courtemanche, Versailles (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 370 days.

(21) Appl. No.: 14/762,303

(22) PCT Filed: Jan. 31, 2014

(86) PCT No.: PCT/FR2014/050180
§ 371 (c)(1),
(2) Date: Jul. 21, 2015

(87) PCT Pub. No.: WO2014/122384
PCT Pub. Date: Aug. 14, 2014

(65) Prior Publication Data
US 2015/0362535 A1 Dec. 17, 2015

(30) Foreign Application Priority Data
Feb. 7, 2013 (FR) ...................................... 13 51056

(51) Int. Cl.
*G01R 21/00* (2006.01)
*G01R 19/00* (2006.01)
(Continued)

(52) U.S. Cl.
CPC ....... *G01R 19/003* (2013.01); *G01R 19/2509* (2013.01); *G01R 19/02* (2013.01); *G01R 31/3648* (2013.01); *H02J 7/045* (2013.01)

(58) Field of Classification Search
CPC ............ G01R 19/0092; G01R 19/0084; G01R 19/00; G01R 21/00; G01R 19/165;
(Continued)

(56) References Cited

U.S. PATENT DOCUMENTS 4,418,310 A * 11/1983 Bollinger .............. H02J 7/0081
320/149
5,578,917 A 11/1996 Bottman
(Continued)

FOREIGN PATENT DOCUMENTS

DE 196 13 736 8/1997
EP 0 128 492 12/1984

OTHER PUBLICATIONS

French Search Report dated Oct. 22, 2013 in French Patent Application No. 1351056 Filed Feb. 7, 2013.
(Continued)

*Primary Examiner* — Hoai-An D Nguyen
*Assistant Examiner* — Taqi Nasir
(74) *Attorney, Agent, or Firm* — Oblon, McClelland, Maier & Neustadt, L.L.P.

(57) ABSTRACT

A method for determining an average value of a periodic or quasi-periodic voltage signal that can be transmitted on a communication bus with a transmission period greater than the period of the signal. The method includes acquiring measurements of the signal with a measurement period corresponding to the transmission period of the average value on the bus, obtaining the average value from the acquired measurements, applying, for each measurement, a variable delay, defining a time of measurement within the measurement period, relative to a reference time, and obtaining the average value from the result of the measurement made at each time of measurement and from the results of the measurements made previously.

10 Claims, 1 Drawing Sheet

(51) Int. Cl.
  *G01R 19/25*   (2006.01)
  *G01R 31/36*   (2006.01)
  *G01R 19/02*   (2006.01)
  *H02J 7/04*    (2006.01)

(58) Field of Classification Search
  CPC .. G01R 19/2513; G01R 21/06; G01R 21/133; G01R 25/00; G01R 33/10; G01R 35/005; G01R 13/02; G01R 13/0272; G01R 17/00; G01R 19/0046
  USPC ......... 324/76.11, 76.12, 600, 612, 617, 621; 702/1, 57, 66, 79, 85, 89, 127, 189, 194, 702/199
  See application file for complete search history.

(56) References Cited

U.S. PATENT DOCUMENTS

| | | | | | |
|---|---|---|---|---|---|
| 8,072,205 | B1* | 12/2011 | Deo | | G01R 19/003 324/76.13 |
| 8,289,001 | B2* | 10/2012 | Aiura | | H02J 7/0073 320/160 |
| 2005/0151532 | A1* | 7/2005 | Seki | | G01R 21/133 324/76.39 |
| 2007/0279039 | A1* | 12/2007 | Seki | | G01R 19/2506 324/76.52 |
| 2010/0052653 | A1* | 3/2010 | LeBrun | | G01R 13/0218 324/76.47 |
| 2010/0060258 | A1* | 3/2010 | Aisa | | H02J 3/00 324/76.39 |
| 2010/0094577 | A1* | 4/2010 | Nose | | H04B 17/15 702/76 |
| 2010/0258682 | A1* | 10/2010 | Fries | | B61L 3/121 246/1 C |
| 2011/0172938 | A1* | 7/2011 | Gu | | G01D 4/002 702/62 |
| 2014/0266832 | A1* | 9/2014 | Schrom | | H02M 3/157 341/144 |

OTHER PUBLICATIONS

International Search Report dated May 2, 2014 in PCT/FR2014/050180 Filed Jan. 31, 2014.

* cited by examiner

METHOD FOR DETERMINING THE AVERAGE VALUE OF A PERIODIC OR QUASI-PERIODIC VOLTAGE SIGNAL

The present invention concerns a method for determining the average value of a periodic or quasi-periodic voltage signal.

It applies in particular, but not exclusively, to determining the average value of a voltage signal of a battery cell in the context of managing the charging of high voltage batteries fitted in electric or hybrid motor vehicles, for supplying an electric drive motor of these vehicles. This type of battery conventionally comprises a plurality of electric accumulators, or cells, including a rechargeable electrochemical system intended for supplying a nominal voltage.

For recharging these high voltage batteries, it is known, for example, to provide an integrated charger in the electric vehicle, of the type including a power converter controller, capable of delivering a charging power to the battery cells directly from a single-phase or three-phase power supply network to which it is connected. When charging a battery with certain chargers, the charge current may present at the charger output a residual periodic or quasi-periodic undulation (commonly known as a current 'ripple', in English terminology), due to incomplete suppression of the AC component of the signal within the charger. This residual AC component of the charge current has a base frequency which is a multiple of the carrier frequency of the electrical network from which the charge current is derived and creates a proportional voltage undulation in the battery cells during charging, which proves troublesome for accurately determining the value of the average voltage across the battery cell terminals.

However, knowledge of the average voltage across the battery cell terminals is information necessary for the correct operation of the battery management system (BMS), which is the member having the function of monitoring the parameters for each cell of the battery according to measurements made by various sensors, such as current, voltage and temperature sensors, so as to maintain the battery in an optimal operating state, particularly in relation to the operating constraints of the electric vehicle. In particular, knowledge of the average voltage across the battery cell terminals allows the BMS to control the powers available in charging and discharging, to know the state of charge of the battery, to control the end of charge or to preserve the integrity of the battery with respect to possible overvoltages in the cells.

The limits of the conventional solutions for measuring the voltage across the battery cell terminals during charging, with regard to voltage fluctuations generated by the charge current ripple, arise from the fact that the frequency of the measurements is low compared with the frequency of the voltage fluctuations (undersampling) and this frequency is further imposed by other system constraints. In this case, the voltage seen by the system is either 'frozen' on a fixed value corresponding to the average voltage across the cell terminals, plus or minus the amplitude of the fluctuation, or fluctuating in this same interval.

From patent document U.S. Pat. No. 4,418,310, a device is known for controlling a battery charger for an electric vehicle in response to a state of actual charge of the battery, said device monitoring the actual voltage across the battery cell terminals as an indicator of the state of charge of the battery, in order to automatically disconnect the charger from the battery and thus stop the charging, to avoid overvoltages across the battery terminals. To do this, the control device notably includes means for calculating an average voltage across the battery cell terminals taken over a predetermined period of time. According to this document, this predetermined period of time for the averaging is selected to be sufficiently long, e.g. in excess of one minute, so as to eliminate, or at least to limit, any interference on the calculated variable, related to momentary variations in the charger output voltage, the current 'ripple', as well as other line noises. However, in addition to the risk of 'frozen' measurements as mentioned above, the solution of measuring the average voltage across a battery cell's terminals recommended by this document, is based on overly long averaging periods, which are incompatible with the constraints of the system, requiring in particular sending the calculated average to the BMS at regular intervals close together, typically every 100 ms.

In this context, one object of the invention is to provide a method for determining the average value of a periodic or quasi-periodic voltage signal, particularly of a voltage signal across the cell terminals of a high voltage battery for an electric vehicle when it is charged, which is free of the limitations previously mentioned and, in particular, which provides a satisfactory level of performance in a context of undersampling of the signal imposed by system constraints linked to the transmission of this average value periodically on a communication bus.

To this end, the invention concerns a method for determining the average value of a periodic or quasi-periodic voltage signal intended to be transmitted on a communication bus with a transmission period greater than the period of said signal, in which measurements of said signal are acquired with a measurement period corresponding to the transmission period of said average value on the bus, and said average value is obtained from said acquired measurements, said method being characterized in that it includes steps of:

applying (S2), for each measurement, a variable delay, defining a measurement instant ($T_i$) within said measurement period with respect to a reference instant, obtaining (S6) said average value from the result of the measurement carried out at each measurement instant ($T_i$) and from the results of the measurements made previously.

This strategy for determining the average value, based on applying during each measurement a variable delay, before performing the measurement itself, is advantageously much less demanding on the electronic components and therefore much less expensive, compared with solutions for obtaining the average value by performing a fast sampling.

According to other advantageous features of the method in accordance with the invention, taken singly or in combination:

said variable delay applied for each measurement follows a sequence of variable delays preferably consisting of a predetermined sequence of delays in which the delays vary over at least two predetermined separate delay values;

in a variant, said variable delay applied for each measurement may be determined randomly;

said method includes a step of transmitting on said communication bus with said transmission period said average value thus obtained;

said step of obtaining the average value may include calculating a weighted average of the current measurement result with the latest average voltage value obtained;

said step of obtaining the average value may in a variant include calculating a weighted average of the current measurement result with some previous measurement results.

said method applies advantageously to determining the average value of a voltage signal of a high voltage battery cell of an electric or hybrid motor vehicle, during the application of a charge mode of said battery, in which the charge current supplied by means of a charger presents a periodic or quasi-periodic fluctuation, said method being deactivated in usage modes of said battery other than said charge mode;

said method may include a step of selecting said sequence of variable delays according to the potential frequencies of said fluctuations of the charge current supplied by said charger;

said method may include a step of selecting said sequence of variable delays according to said measurement period and/or the number of measurements for obtaining said average value and/or the accuracy required for said average value;

said method may include a preliminary step of estimating the variation in accuracy of said average value according to predetermined sequences of variable delays capable of being applied and a step of selecting said predetermined sequence of delays to be applied appropriate to maximizing the accuracy.

Other features and advantages of the invention will emerge clearly from the description which is given below, as a guide and in no way restrictive, with reference to the accompanying drawings in which.

Figure 1:
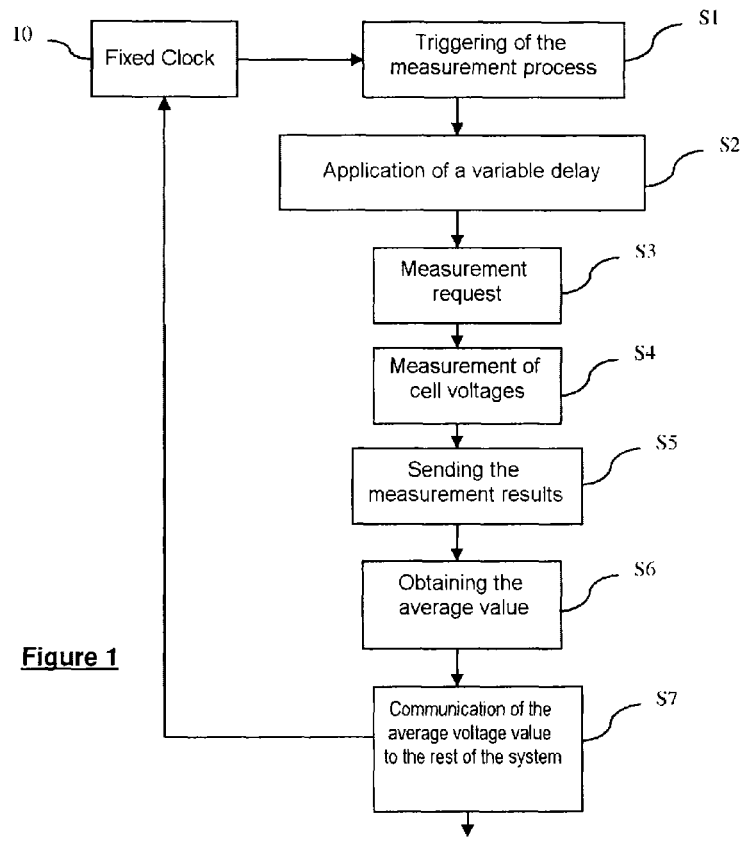
FIG. 1 is a flowchart representing the main steps taken into account during the progress of the method for determining the average voltage in accordance with the invention.

The operations performed within the battery monitoring system are carried out at a regular time interval, fixed by a system clock 10, as illustrated in FIG. 1. In particular, the clock 10 of the battery control system is designed, in a step S1, for triggering a measurement process, in which measurement components are arranged for acquiring measurements of all the voltages across the cell battery terminals with a measurement period fixed by the clock 10, in response to a measurement request sent by a member for monitoring the measurement components. The fixed measurement period meets various constraints of the battery control system, and corresponds to the period $P_c$ according to which the average voltage value resulting from the measurement made by the measurement components must be sent on a system communication bus for being made available to the system, this transmission period $P_c$ on the communication bus being greater than the period of the voltage signal that is to be measured. The measurement acquisition frequency is thus locked onto the transmission frequency on the communication bus.

The functions of the measurement components are, for example, implemented in physical form by a device or a dedicated component, such as an ASIC (Application-Specific Integrated Circuit in English).

In accordance with the invention, in a step S2, during each measurement phase implemented for acquiring a measurement of the voltage signal across the battery cell terminals with the measurement period $P_c$ fixed by the clock 10, a variable delay is applied before sending, in a step S3, the measurement request to the measurement components. Thus, for each of N successive measurement phases $(\varphi_i)_{1 \leq i \leq N}$, N corresponding to the number of measurements on which the average will be carried out, a variable delay $(D_i)_{1 \leq i \leq N}$ is to be applied, defining a measurement instant $T_i$ within the measurement period, so that a measurement is made at each instant $T_i = T_0 + i \times P_c + D_i$, for $1 \leq i \leq N$ and $T_0$ a reference instant corresponding to the triggering of the measurement process.

Advantageously, the variable delay applied for each measurement phase follows a predetermined sequence of delays in which the delays vary over at least two predetermined separate delay values.

The applied delays therefore preferably follow a predetermined sequence of variable delays, which is selected according to several parameters, taken alone or in combination, including the measurement period fixed by the clock 10, the number of measurements on which the average will be carried out, potential frequencies of the fluctuations in the charger current (current ripple) during battery charging, and the accuracy required for determining the average voltage.

In order to make the selection of the predetermined delay sequence most appropriate to determining a consistent average value of the voltage of the battery cells, a preliminary phase may be implemented of estimating the variation in accuracy of the average voltage obtained according to predetermined sequences of variable delays capable of being applied, then the predetermined sequence of delays to be applied is selected, so as to maximize the accuracy.

Alternatively, during step S2, rather than applying a delay following a predetermined sequence of delays, a delay is applied that is determined randomly during each measurement phase before sending the measurement request to the measurement components.

Figure 2:
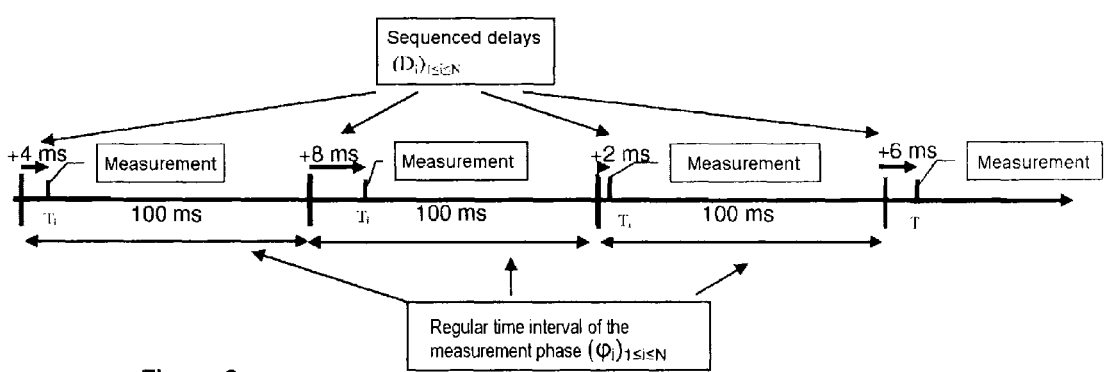
FIG. 2 is a timing diagram representing the temporal evolution of the measurement process leading to the determination of the average voltage, according to a particular embodiment.

FIG. 2 illustrates the chronology of a predetermined sequence of delays in the particular case of a battery monitoring system imposing a measurement period equal to 100 ms, on a charging system potentially subject to current fluctuations of 100 Hz to 120 Hz. The following predetermined sequence of delays [+0; +4; +8; +2; +6] ms as illustrated in FIG. 2 is an example of a sequence of delays giving a good level of performance, with subsequent smoothing performed via the algebraic average of the last 5 measurement values, as will be explained farther on.

The application, in each measurement phase, of a delay following a predetermined sequence of variable delays can actually be used to sequentially modify the duration between each measurement performed by the measurement components and thus modifies the distribution of the various measurement instants within each successive measurement phase implemented for obtaining the average. Since the voltage signal to be averaged is a more or less periodic signal, this distribution made different from the measurement instants within the measurement period fixed for each successive measurement phase can advantageously be used to obtain a consistent average over all the measurement results.

Again with reference to FIG. 1, at each measurement phase, after the expiration of the delay applied following the predetermined sequence of delays or, alternatively, applied randomly, the measurement request is sent in step S3 by the monitoring member to the measurement components, which therefore, in a step S4, carry out the measurement of all the voltages across the battery cell terminals at each measurement instant $T_i$ defined within the measurement period according to the applied variable delay. In a step S5, at each measurement instant T_i, the measurement results obtained are then sent back to the monitoring member, automatically or at the latter's request, and are stored in memory. Based on the current measurement result and previous results stored in memory, a step S6 for obtaining the average value of the voltage is implemented, providing the average value of the voltage across the battery cell terminals. This average may, for example, be algebraic, or may also be obtained using weighting coefficients, or by means of any other known method of smoothing results. Preferably, the current measurement result may be averaged with the latest determined average voltage value. The average voltage thus obtained is then made available to the rest of the system in a step S7, so that the average voltage is periodically transmitted on the system communication bus with a transmission period equal to 100 ms according to the example in FIG. 2.

The strategy for determining the average voltage across the battery cell terminals that has just been described with reference to the steps described in FIG. 1 and which is essentially based on the application, before the measurement request is sent for each measurement phase implemented, of a variable delay following a predetermined or, alternatively, randomly determined sequence of delays, then on a smoothing of the measurement results obtained, is preferably activated only during a charge mode of the battery cells and is deactivated in battery usage modes other than the charge mode, e.g. in running mode. Indeed, a faster dynamic may be necessary outside of the battery charge mode, e.g. in vehicle running mode. Thus, deactivation of the strategy for determining the average voltage across the battery cell terminals in accordance with the invention according to mode, can advantageously be used to maintain this dynamic.

In addition, a chronology with a sequence of known delays, e.g. delays between 0 and 10 ms, and a known measurement time, typically between 5 and 30 ms, can advantageously be used to maintain a fixed, regular reserve time during each measurement phase, usable for other operations to be carried out by the system, such as performing diagnostics, cell balancing, temperature measurement, etc.

The invention claimed is:

1. A method for determining an average value of a periodic or quasi-periodic voltage signal in which the average value is transmitted on a communication bus with a transmission period greater than the period of the signal and in which measurements of the signal are acquired with a measurement period corresponding to the transmission period of the average value on the bus, and the average value is obtained from the acquired measurements, the method comprising:

applying, for each measurement, a variable delay, defining a measurement instant within the measurement period with respect to a reference instant;

obtaining the average value from the result of the measurement carried out at the measurement instant and from the results of the measurements made previously.

2. The method as claimed in claim 1, wherein the variable delay applied for each measurement follows a sequence of variable delays of a predetermined sequence of delays in which the delays vary over at least two predetermined separate delay values.

3. The method as claimed in claim 1, wherein the variable delay applied for each measurement is determined randomly.

4. The method as claimed in claim 1, further comprising transmitting on the communication bus with the transmission period the average value thus obtained.

5. The method as claimed in claim 1, wherein the obtaining the average value includes calculating a weighted average of a current measurement result with a latest average voltage value obtained.

6. The method as claimed in claim 1, wherein the obtaining the average value includes calculating a weighted average of a current measurement result with previous measurement results.

7. The method as claimed in claim 2, applied to determining the average value of a voltage signal of a high voltage battery cell of an electric or hybrid motor vehicle, during application of a charge mode of the battery, wherein the charge current supplied by a charger presents a periodic or quasi-periodic fluctuation, the method being deactivated in usage modes of the battery other than the charge mode.

8. The method as claimed in claim 7, further comprising selecting the sequence of variable delays according to potential frequencies of fluctuations of the charge current supplied by the charger.

9. The method as claimed in claim 2, further comprising selecting the sequence of variable delays according to the measurement period and/or a number of measurements for obtaining the average value and/or accuracy required for the average value.

10. The method as claimed in claim 2, further comprising estimating the variation in accuracy of the average value according to predetermined sequences of variable delays capable of being applied and selecting the predetermined sequence of delays to be applied to maximize the accuracy.

* * * * *